(12) United States Patent
Zinn et al.

(10) Patent No.: US 7,061,582 B2
(45) Date of Patent: Jun. 13, 2006

(54) EXPOSURE APPARATUS INCLUDING MICRO MIRROR ARRAY AND EXPOSURE METHOD USING THE SAME

(75) Inventors: Shun Yong Zinn, Suwon (KR); Yong Hoon Kim, Anyang (KR); Seung Hune Yang, Sungnam (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 38 days.

(21) Appl. No.: 10/460,227

(22) Filed: Jun. 13, 2003

(65) Prior Publication Data

US 2004/0057034 A1    Mar. 25, 2004

(30) Foreign Application Priority Data

Sep. 19, 2002    (KR) .................. 10-2002-0057465

(51) Int. Cl.
*G03B 27/54* (2006.01)
*G03B 27/42* (2006.01)
*G03B 27/62* (2006.01)

(52) U.S. Cl. ............... 355/67; 355/53; 355/75

(58) Field of Classification Search ............ 355/67, 355/53, 52, 55, 77; 348/743; 349/4, 77; 347/239; 250/492.1, 492.2
See application file for complete search history.

(56) References Cited

U.S. PATENT DOCUMENTS

| | | | |
|---|---|---|---|
| 5,706,061 A * | 1/1998 | Marshall et al. | 348/743 |
| 6,509,571 B1 * | 1/2003 | Suzuki | 250/492.2 |
| 6,577,379 B1 * | 6/2003 | Boettiger et al. | 355/52 |
| 6,791,666 B1 * | 9/2004 | Yu et al. | 355/55 |
| 2002/0159040 A1 * | 10/2002 | Hamatani et al. | 355/52 |

FOREIGN PATENT DOCUMENTS

| | | |
|---|---|---|
| JP | 9318889 | 12/1997 |
| JP | 10209019 | 8/1998 |

OTHER PUBLICATIONS

Raka Bandyo, "MEMS Technology Development", NASA Undergraduate Student Research Program, Fall 2001, pp. 1-11.

* cited by examiner

*Primary Examiner*—Peter B. Kim
(74) *Attorney, Agent, or Firm*—Volentine Francos & Whitt, P.L.L.C.

(57) ABSTRACT

An exposure method and apparatus for use in exposing a photoresist on a semiconductor wafer do not employ an aperture for shaping the exposure light. The exposure apparatus includes a light source unit, a reflecting mirror unit having a micro mirror array (MMA) and a control unit that controls the MMA, and a pattern transfer unit that transfers the pattern of a photomask onto the photoresist. The angles of inclination of the respective mirrors of the MMA are adjusted to reflect incident light in a manner that shapes the incident light. Accordingly, it is possible to form a pattern having the highest degree of resolution and optimum depth of focus (DOF) in the shortest amount of processing time.

12 Claims, 6 Drawing Sheets

EXPOSURE APPARATUS INCLUDING MICRO MIRROR ARRAY AND EXPOSURE METHOD USING THE SAME

BACKGROUND OF THE INVENTION

1. Field of the Invention

The present invention relates to the photolithography process used in the manufacturing of semiconductor devices. More particularly, the present invention relates to a method of and an apparatus for exposing a semiconductor wafer to transcribe a pattern onto the wafer.

2. Description of the Related Art

Photolithography is one of the major processes of manufacturing a semiconductor device as it is indispensable to the overall process of forming a particular circuit on a wafer. In general, photolithography includes a series of individual processes such as a process of coating a substrate with a photoresist, an exposure process in which the photoresist is exposed to light of a given wavelength, and a process of developing the exposed photoresist. In the exposure process, light is directed through a mask having a particular pattern to transcribe the pattern onto the wafer.

The higher the degree of integration desired for a semiconductor device, the finer are the patterns that must be produced on the wafer. Thus, photolithography is becoming increasingly critical in the overall process of manufacturing semiconductor devices. In particular, the demand for providing more highly integrated semiconductor devices has triggered the need to develop an exposure apparatus and method that can provide a pattern having high degree of resolution and optimum depth of focus (DOF). In general, off axis illumination (OAI) is used in photolithography to secure a high degree of resolution and optimal DOF.

FIG. 1 illustrates a conventional projection-type of exposure apparatus. The projection-type exposure apparatus includes a light source unit 110, an optical lens unit 120, an aperture 130, and a pattern transfer unit 140. The pattern transfer unit 140 includes a plurality of lenses and thus may be regarded as being a part of the optical lens unit 120. However, in this disclosure, the pattern transfer unit 140 will be referred to separately to be differentiate it from the optical lens unit 120, in consideration of its dedicated function of transferring the pattern of the photomask 144 thereof onto a wafer.

The light source unit 110 includes a light source 112 and oval mirrors 114 that encompass the light source 112. Light having a particular wavelength is emitted from the light source 112. The light emitted from the light source 112 in various directions is reflected in one direction by the oval mirrors 114.

The optical lens unit 120 includes a collecting lens 122 and a fly's eye lens 124. The collecting lens 122 focuses light emitted from the light source 112 into parallel light rays, and the fly's eye lens 124 focuses the parallel rays of light such that they will be uniformly incident on a target object.

The light passes through the fly's eye lens 124 and travels toward the aperture 130 before the light reaches a condensing lens 142 of the pattern transfer unit 140. The aperture 130 has two regions: an open area through which the light passes and a blocking area that blocks the light. The open area of the aperture 130 has a specific shape. In OAI, a vertical component, i.e., the $0^{th}$ order, of incident light is removed using the specific shape of the aperture 130. Therefore, light passing through the aperture 130 is incident on the photomask 144 via the condensing lens 142 at a predetermined oblique angle rather than at a right angle.

FIG. 2 illustrates various types apertures used in a conventional projection-type of exposure apparatus. In FIG. 2, the cross-hatched portions denote the blocking regions of the apertures. The conventional illustrated apertures are a circular aperture, a quadrupole type of aperture, a dipole type of aperture, and an annual aperture. However, other types of apertures are also known.

Referring again to FIG. 1, the light passing through the aperture 130 is condensed by the condensing lens 142. The condensed light rays are incident on the photomask 144 that bears a mask pattern. Next, the condensed rays of light passing through the photomask 144 pass through a projecting lens 146 and are finally focused on a semiconductor wafer 150 disposed on a wafer holder 160.

However, the aperture 130 must be tailored to the pattern formed on the photomask 144 in order to obtain a pattern having the highest resolution and optimum DOF using OAI. That is, if the photomask 144 is changed to one whose pattern has a different size, shape, and/or spacing, the aperture 130 must be replaced with one that is matched to the new pattern.

In general, 20–30 sheets of photomasks are used to manufacture one integrated semiconductor device, whereas a projection-type of exposure apparatus is equipped with only several apertures. If necessary, an aperture 130 may be detached from the projection-type of exposure apparatus and replaced with a new aperture.

Accordingly, a conventional exposure apparatus and method have some disadvantages. First, the shapes of the available apertures are limited. That is, only several types of apertures are available and thus, there is a high probability that none of the available apertures is an optimal match for the pattern of the selected photomask. Accordingly, in most cases, it is difficult to precisely transcribe the pattern of a photomask and form a pattern having the highest resolution and optimum DOF on a wafer using a conventional exposure apparatus and method.

Secondly, the conventional exposure apparatus is inconvenient in that the aperture must often be exchanged during the process of manufacturing a semiconductor device. The operation of the exposure apparatus must be temporarily discontinued while the apertures are being exchanged, thereby increasing the total time of the exposure process and consequently lowering the productivity of the manufacturing process.

Thirdly, as described above, an aperture has two regions: an open region that allows light to pass through the aperture, and a blocking region that prevents light from penetrating the aperture. In other words, not all the light that is incident on the aperture passes through the aperture to the semiconductor wafer. Accordingly, the conventional exposure process is not marked by energy efficiency meaning that the exposure time must be long to satisfactorily complete an exposure process. Therefore, the overall manufacturing process using the conventional exposure method and apparatus also takes a long time to complete.

SUMMARY OF THE INVENTION

One object of the present invention is to an exposure method of apparatus which can form a pattern having a high degree of resolution and optimum depth of focus (DOF) on a semiconductor wafer. Another object of the present invention is to provide an exposure method and apparatus which can form a pattern in a relatively short amount of time, i.e., which are characterized by providing a short exposure time.

To achieve these objects, an exposure apparatus according to an aspect of the present invention comprises a reflecting mirror unit having a micro mirror array (MMA). The MMA is interposed, along the optical axis of the apparatus, between a light source unit and a pattern transfer unit. The pattern transfer unit includes a photomask bearing a pattern to be transferred to the photoresist. The exposure light from the light source is thus reflected by the MMA through the photomask of the pattern transfer unit.

Preferably, the reflecting mirror unit also comprises driving units disposed on the backs of the mirrors of the MMA, respectively, and operative to adjust the angles of inclination of the mirrors. The reflecting mirror unit may also include a control unit for controlling the operations of the driving units.

The control unit may include an input section by which information regarding the pattern of a photomask can be input, a processor configured to determine the optimum angles of the respective mirrors of the MMA based on the information input via the input section, and a controller controlling the operations of the driving units based on the determinations made by processor.

According to the exposure method of the present invention, the exposure light generated by the light source is reflected along an optical axis through the photomask and towards the photoresist with the micro mirrors. Preferably, the angles of inclination the respective mirrors are established to reflect the incident light at an optimum angle and in an optimum direction, relative to the optical axis, on the basis of information regarding the pattern of the photomask. In this respect, the orientations of the micro mirrors may be adjusted individually, e.g., by the controller of the apparatus.

According to still another aspect of the exposure method according to the present invention, information regarding the pattern to be transferred to the photoresist is acquired or otherwise quantified. A desired form for the shape of the exposure light to be directed through the photomask and onto the photoresist is predetermined from the information regarding the pattern of the photomask. The micro mirrors are oriented to shape the exposure light into the desired form.

Finally, in all cases the rays of the exposure light are preferably reflected by the MMA onto the photomask at oblique angles relative to the plane of the photomask so as to take advantage of the off-axis illumination technique.

BRIEF DESCRIPTION OF THE DRAWINGS

The above and other objects, features and advantages of the present invention will become more apparent from the following detailed description of the preferred embodiments thereof made with reference to the attached drawings in which.

DETAILED DESCRIPTION OF THE PREFERRED EMBODIMENTS

Figure 1:
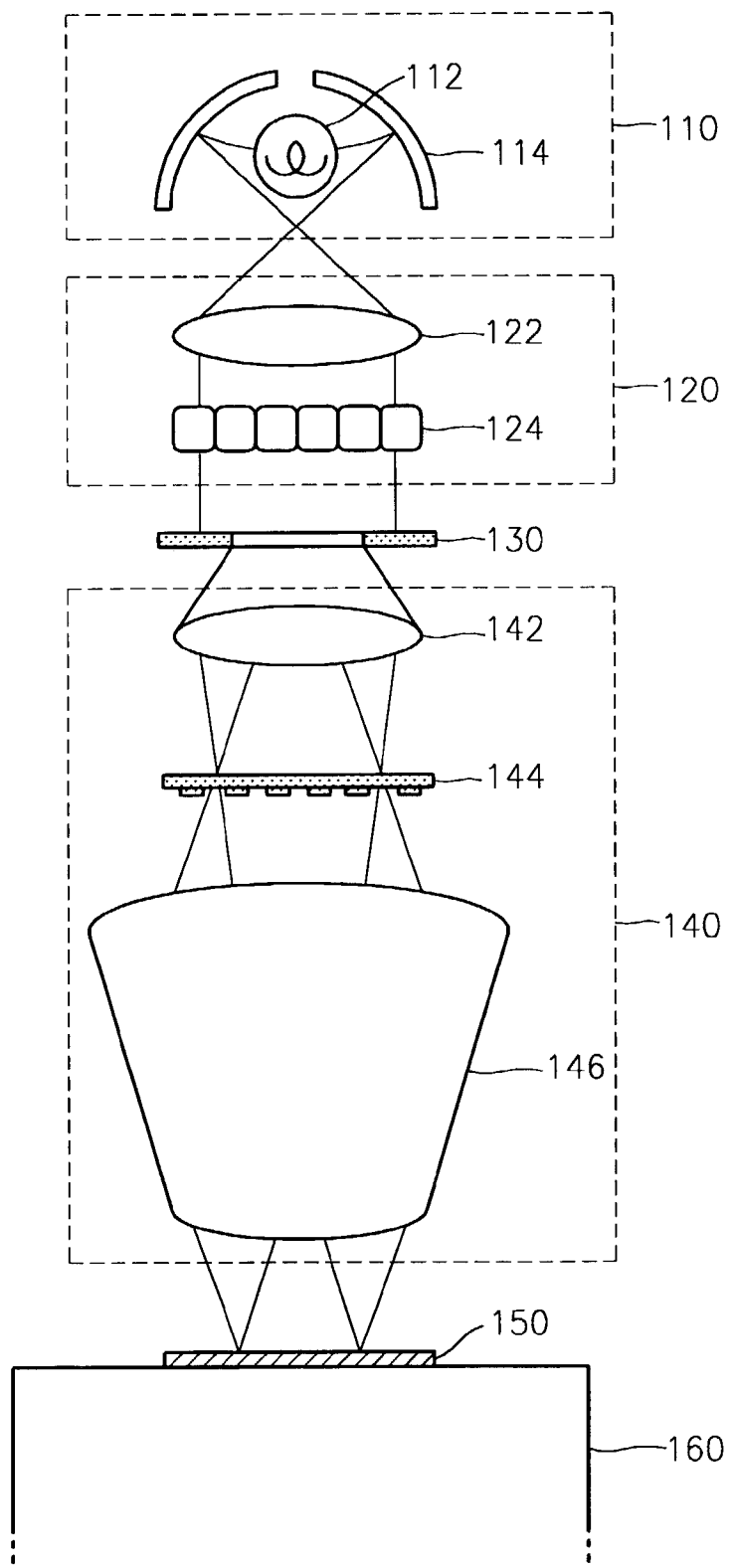
FIG. 1 is a schematic cross-sectional view of a conventional projection-type of exposure apparatus.
Figure 2:
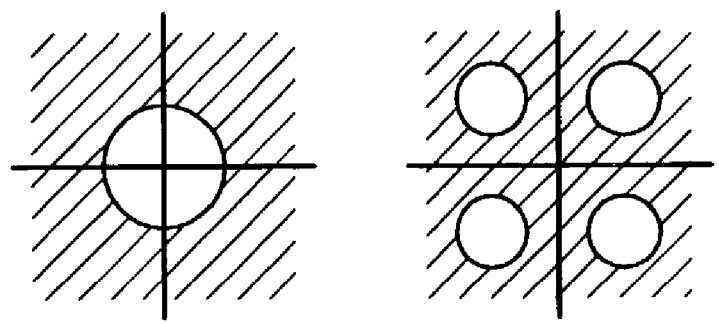
FIG. 2 is a schematic diagram of various types of apertures that are used in a conventional projection-type of exposure apparatus.
Figure 2:
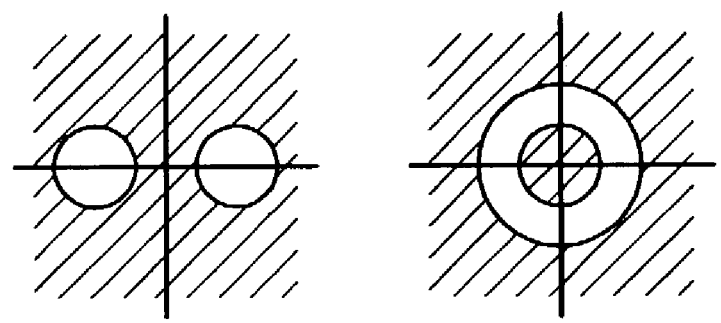

The present invention will now be described more fully with reference to the accompanying drawings. Also, it should be noted that like reference numerals designate like elements throughout the drawings.

Figure 3:
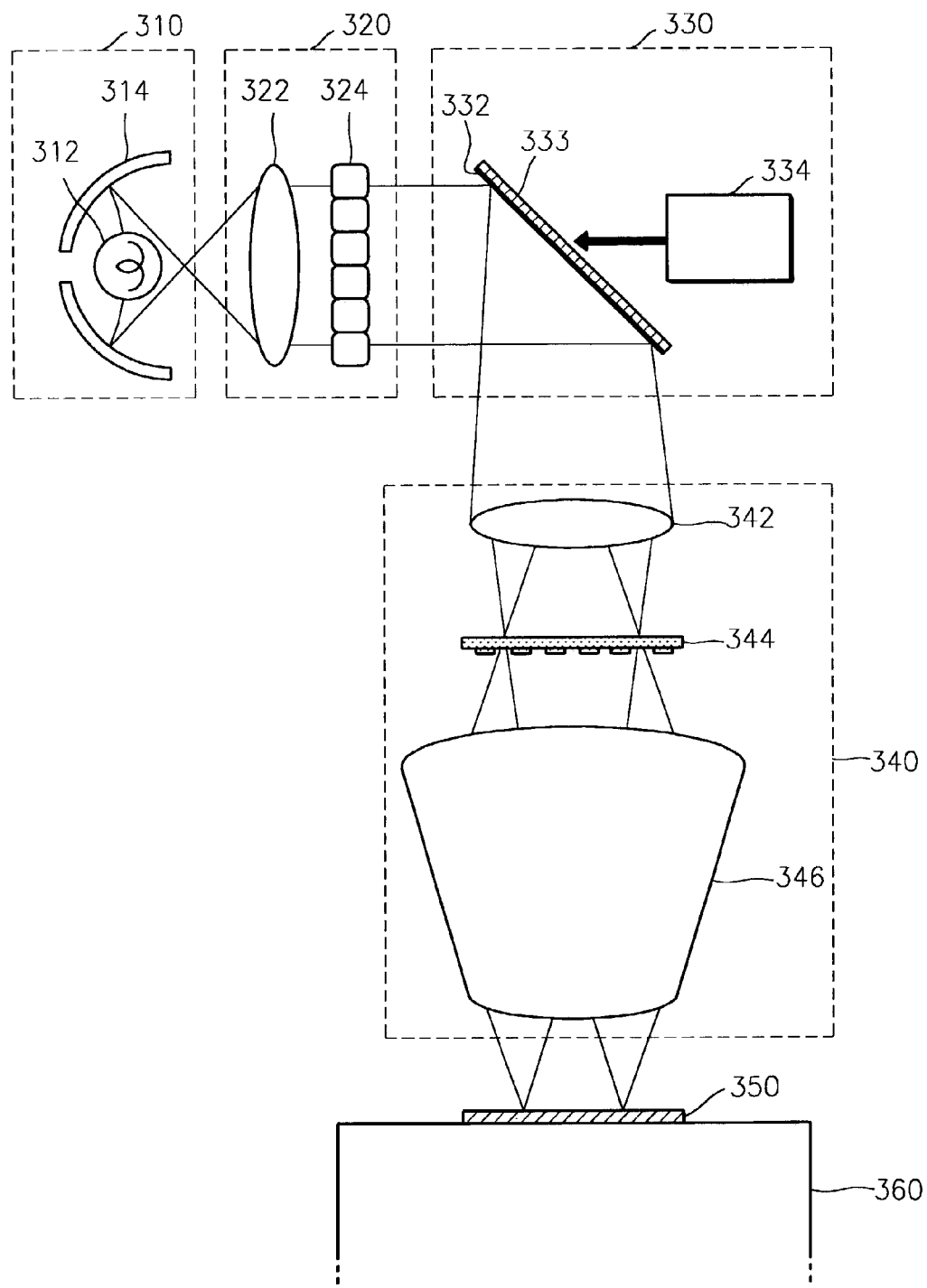
FIG. 3 is a cross-sectional view of an exposure apparatus including a micro mirror array according to the present invention.

Referring first to FIG. 3, the projection-type of exposure apparatus according to the present invention includes a light source unit 310, an optical lens unit 320, a pattern transfer unit 340, and a reflecting mirror unit 330 interposed between the optical lens unit 320 and the pattern transfer unit 340 with respect to the optical axis of the apparatus. The reflecting mirror unit 330 reflects light at a desired angle from light source unit 310 to the pattern transfer unit 340. Similar to the conventional exposure apparatus shown FIG. 1, the light source unit 310 includes a light source 312 and oval mirrors 314, the optical lens unit 320 includes a collecting lens 322 and a fly's eye lens 324, and the pattern transfer unit 340 includes a photomask 344 and a projecting lens 346.

The reflecting mirror unit 330 according to the present invention will be explained in greater detail with reference to FIGS. 3 through 5.

The reflecting mirror unit 330 includes a micro mirror array (MMA) 332. Driving units 333 are preferably installed on the backs of the mirrors of the MMA 332, respectively, so that the angles of the respective mirrors can be adjusted. Also, the reflecting mirror unit 330 may further include a control unit 334 that controls the operations of the driving units 333. The driving units 333 may be controlled using electrostatic or external electrical signals.

Figure 4:
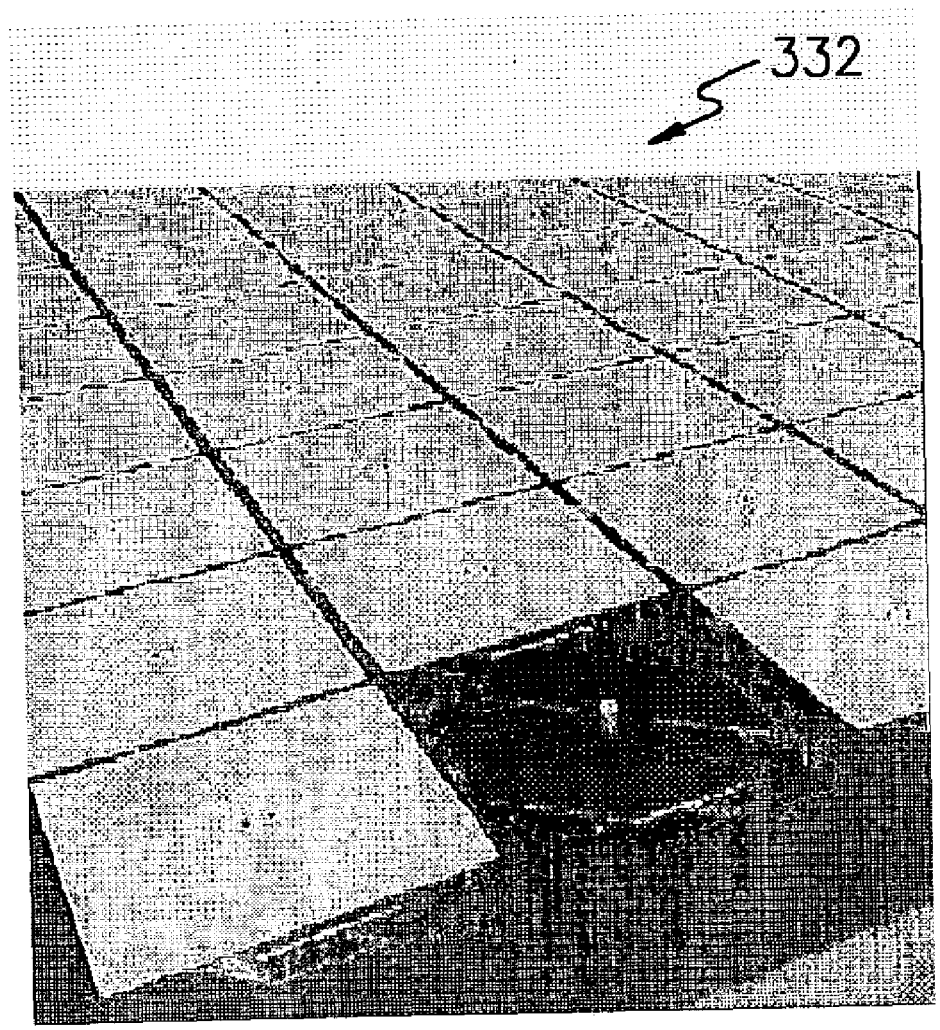
FIG. 4 is a magnified view of a photograph of a portion of the micro mirror array of the exposure apparatus shown in FIG. 3.

As best shown in FIG. 4, the MMA 332 includes a plurality of micro mirrors, i.e., a plurality of mirrors disposed side-by-side and whose dimensions are each on the order of microns. For example, the MMA comprises mirrors of 50 μm×50 μm arrayed in two orthogonal directions. Accordingly, all of the light incident on the MMA 332 is reflected. Thus, theoretically, the MMA 332 will not cause energy loss.

As mentioned above, a respective driving unit 333 is installed on the back surface of each of the mirrors of the MMA 332 so that the angle of each mirror of the MMA 332 can be easily changed to adjust the angle of reflection and hence, the direction of the light. Accordingly, the reflected light can assume various shapes depending on the angles of the respective mirrors.

Figure 5:
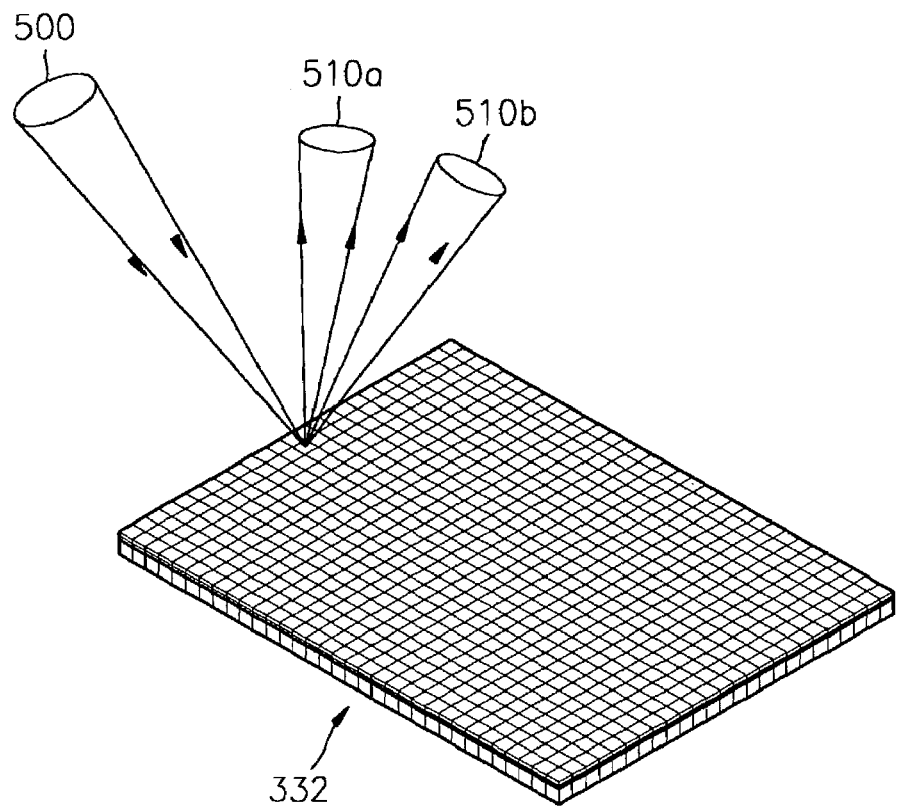
FIG. 5 is a schematic diagram illustrating the function of the micro mirror array, of the exposure apparatus according to the present invention.

FIG. 5 illustrates the incident light 500 being reflected at different angles by a mirror of the MMA 332, and the resulting reflected lights 510a and 510b. That is, the same incident light can be reflected at different angles by adjusting the angles of the respective mirrors of the MMA 332 using the driving units 333. If the angles of the mirrors are changed appropriately, the angle at and direction in which the reflected light propagates is changed. In this way, the reflected light may be provided with the same characteristics as incident light passing through a conventional aperture having a particular shape, but without the accompanying energy loss.

That is, according to the present invention, light rays emitted from the light source unit 310 of FIG. 3 are incident on the MMA 332 and are all reflected onto the condensing lens 342 of the pattern transfer unit 340. On the contrary, in the conventional exposure apparatus of FIG. 1, a portion of the incident light passing through the aperture is absorbed by the blocking region of the aperture, i.e., does not reach the pattern transfer unit 140 of FIG. 1. However, when the MMA 332 is used, the reflection angle and direction of incident light is adjusted so that all of the incident light passes through the pattern transfer unit 340, whereby the energy of all of the incident light is transferred to the photoresist on the semiconductor wafer 350.

As mentioned above, the reflecting mirror unit 330 preferably includes a control unit 334 that controls the operations of the driving units 333. The control unit 334 may comprise a switching unit or an automated computer system.

If an automated computer system is used as the control unit 334, the control unit 334 may include an input section into which information regarding the pattern of the photomask 344 is input, a processor that determines the optimum angles of the respective mirrors based on the information input to the input section, and a controller that controls the operations of the respective driving units 333 based on the determination made by the processor. Alternatively, the processor may have a memory device that stores data regarding the optimum angles of the respective mirrors for the photomask 344. In this case, the control unit 334 is capable of receiving information via the input section thereof, automatically detecting internal data, and controlling the operation of the MMA 332 so as to provide the optimum angle(s) for the respective mirrors.

According to the present invention, the shape of reflected light may be embodied, in accordance with the pattern of the photomask 344, using the MMA 332. For instance, circular, quadrupole, dipole, or annular forms of light can be obtained as in a conventional exposure apparatus. However, the shape of the reflected light that can be produced according to the present invention may be totally different from that which can be produced in the conventional exposure apparatus. In any case, the reflected light has a comparatively high degree of resolution and optimum depth of focus (DOF).

An example of a method of determining the optimum shape of the aperture is described in the commonly assigned Korean Patent Application No. 2002-0035173 entitled "Simulation Method and Apparatus for Designing Aperture for Exposure Apparatus, and Recording Medium for Recording the Simulation Method". The contents of the above Korean patent application are hereby incorporated by reference. Similarly, data regarding the optimum shape of the reflected light in accordance with the present invention can be obtained using the simulation method described in the Korean patent application. The data may be stored in the control unit 334 and used when determining the angles of reflection based on the information input to the control unit 334.

Hereinafter, a process of transferring a pattern onto a semiconductor wafer using the aforementioned exposure apparatus will be described with reference to FIGS. 3, 6, and 7.

Figure 6:
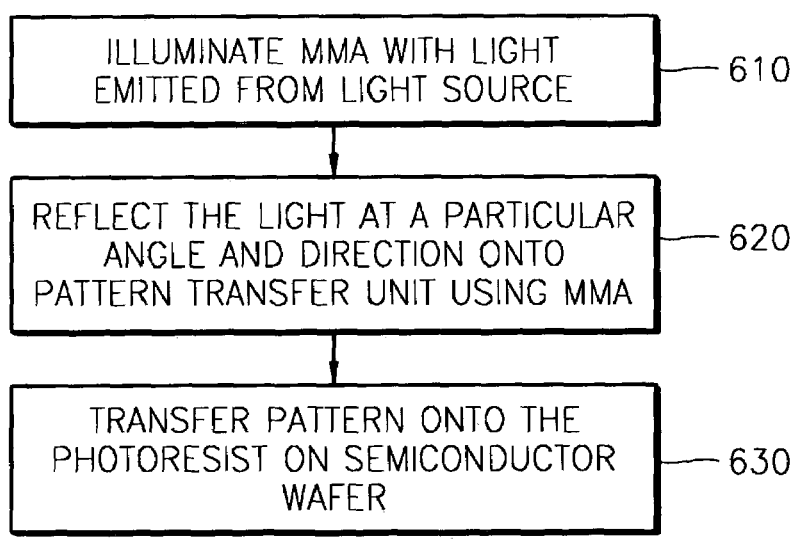
FIG. 6 is a flowchart of an exposure method according to the present invention.
Figure 7:
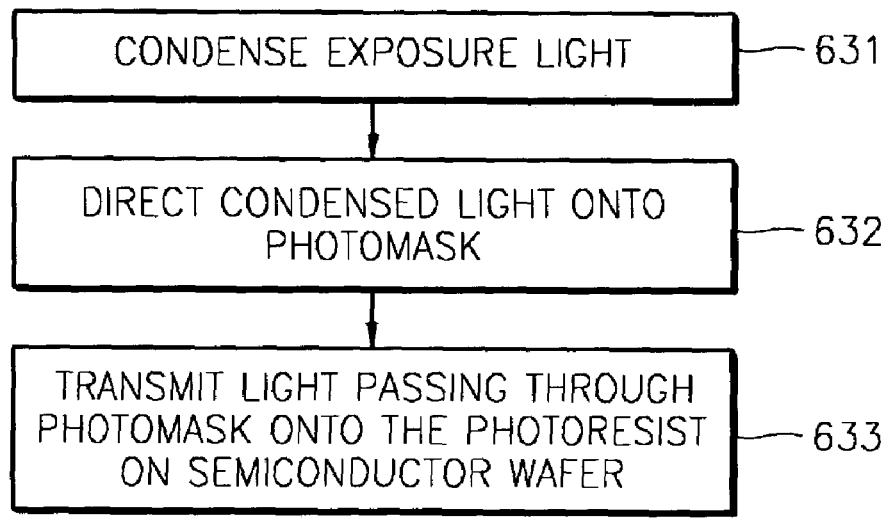
FIG. 7 is a flowchart of an operation of transferring a pattern onto a wafer in the method illustrated in FIG. 6.

Referring first to FIGS. 3 and 6, light emitted from the light source 312 is reflected by the oval mirrors 314 onto the optical lens unit 320. The incident light passes through the collecting lens 322 and the fly's eye lens 324 of the optical lens unit 320, and is then incident on the MMA 332 of the reflecting mirror unit 330 (step 610).

After step 610, the light incident on the MMA 332 is reflected onto the pattern transfer unit 340 (step 620). The shape of the reflected light is controlled by the control unit 334. For instance, the control unit 334 transmits signals to the driving units 333 of the respective mirrors of the MMA 332 individually in order to establish the direction and angle of reflection of the light.

Subsequently, the light reflected from the MMA 332 passes through the pattern transfer unit 340. As a result, the pattern of the photomask 344 is transferred to the photoresist on the semiconductor wafer 350 (step 630). More specifically, referring to FIG. 7, the light illuminated by the MMA 332 is condensed by the condensing lens 342 (631). Next, the condensed light is incident on the photomask 344 that bears a particular (mask) pattern (step 632). The light is incident on the condensing lens 342 at an oblique angle to take advantage of the effect provided for by using off-axis illumination (OAI). The light passing through the photomask 344 is then transmitted onto the photoresist on the semiconductor wafer 350, via the projecting lens 346 (633).

Figure 8:
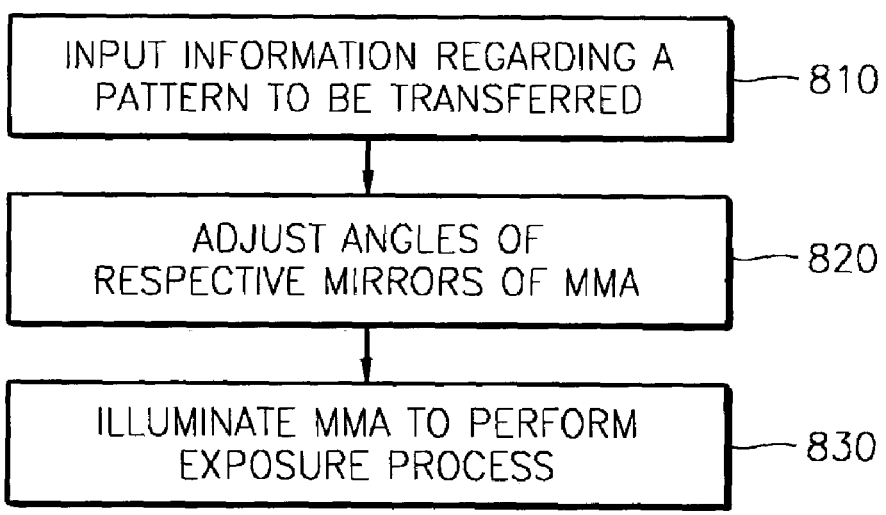
FIG. 8 is a flowchart of an exposure method according to the present invention.

A more detailed description of the exposure method according to the present invention will now be made with reference to FIGS. 3 and 8.

First, information on the pattern of the photomask 344 is input into the control unit 334 via the input section thereof (step 810). Next, the processor of the control unit 334 compares the input information with existing data stored therein, thereby correlating the pattern of the photomask with an optimum shape for the light that is to illuminate the mask, and determines the optimum angles of the respective mirrors based on the comparison. The controller of the control unit 334 then operates the driving units 333 to position the respective mirrors of the MMA 332 at the optimum angles (step 820). Subsequently, light emitted from the light source 310 is incident on the MMA 332. The MMA 332 reflects the incident light in a particular shape that is best suited to the pattern of the photomask 344, and the pattern of the photomask 344 is thereby transferred onto the photoresist on the semiconductor wafer 350 (step 830).

An exposure apparatus and method according to the present invention has many advantages. First, a pattern having the highest degree of resolution and optimum DOF can be formed on a semiconductor wafer by establishing appropriate orientations of the individual mirrors of the MMA. For example, the mirrors can be individually adjusted to set the direction and angle of the reflected light in such a way that the mask pattern is optimally transferred to the photoresist.

Secondly, an exposure apparatus according to the present invention does not require an aperture. Thus, there is no need to exchange apertures and stop the operation of the exposure apparatus. Accordingly, the method of the present invention can be conducted more productively than the conventional exposure method.

Thirdly, the semiconductor wafer can be illuminated with practically all of the light emitted by the light source. Thus, the intensity of the light that irradiates the photoresist is higher than the conventional method in which some of the light is blocked by an aperture. For this reason, exposure time according to the present invention is shorter than in the conventional exposure method.

Lastly, in an exposure method according to the present invention, information regarding the pattern of the photomask is input to a control unit and then an MMA is controlled to reflect incident light at a particular angle and in a particular direction. Accordingly, the exposure method and apparatus of the present invention can be used in photolithography to fabricate a pattern having a higher degree of resolution and DOF than can be achieved using a conventional exposure method and apparatus.

Finally, although the present invention has been described above in connection with the preferred embodiments thereof, various changes can be made to the preferred embodiments as will be apparent to those of ordinary in the art. All such changes are thus seen to be within the true spirit and scope of the present invention as defined by the appended claims.

What is claimed is:

1. An exposure apparatus for use in the manufacturing of semiconductor devices, the exposure apparatus comprising:
   a light source that emits light which propagates along an optical axis of the apparatus;
   a pattern transfer unit including a photomask that bears a pattern to be transcribed, said mask being situated along said optical axis; and
   a reflecting mirror unit disposed along said optical axis between said light source and said pattern transfer unit, said reflecting mirror unit including a micro mirror array (MMA) comprising a plurality of micro mirrors positioned in the apparatus so as to reflect light emitted by said light source to said pattern transfer unit;
   wherein the reflecting mirror unit directs the light emitted by the light source onto the photomask at oblique angles relative to a plane of the photomask to prevent $0^{th}$ order incident light from reaching the photomask.

2. The exposure apparatus of claim 1, wherein said mirrors are supported in said reflecting mirror unit such that relative inclinations thereof can be individually adjusted, and the reflecting mirror unit further comprises driving units disposed on back surfaces of the mirrors, respectively, and operative to adjust the inclination of said mirrors.

3. The exposure apparatus of claim 2, wherein the reflecting mirror unit comprises a control unit operatively connected to said driving units so as to control the operations of the driving units.

4. The exposure apparatus of claim 3, wherein the control unit comprises:
   an input section by which information regarding the pattern of the photomask can be input;
   a processor operatively connected to said input section and configured to determine angles of inclination for the respective mirrors of the MMA based on the information input via said input unit; and
   a controller operatively connected to said processor and to said driving units so as to control the operations of the driving units based on determinations made by said processor.

5. The exposure apparatus of claim 1, wherein said pattern transfer unit comprises a condensing lens and a projecting lens disposed on opposite sides of said photomask with respect to said optical axis of the apparatus.

6. A method of exposing a photoresist, the method comprising:
   generating exposure light;
   providing a photomask having a pattern that is to be transferred to the photoresist; and
   reflecting the exposure light along an optical axis through the photomask and towards the photoresist with an array of micro mirrors disposed side-by-side;
   wherein the array of micro mirrors directs the exposure light onto the photomask at oblique angles relative to a plane of the photomask to prevent $0^{th}$ order incident light from reaching the photomask.

7. The method of claim 6, wherein said reflecting comprises establishing the inclinations of said micro mirrors individually, relative to said optical axis, on the basis of information regarding the pattern of the photomask.

8. The method of claim 7, wherein said reflecting comprises adjusting the inclinations of said micro mirrors individually on the basis of said information.

9. The method of claim 7, wherein said reflecting comprises directing rays of the exposure light onto the photomask at oblique angles relative to the plane of the photomask.

10. A method of exposing a photoresist, the exposure method comprising:
    providing a photomask having a pattern to be transferred to the photoresist;
    quantifying information regarding the pattern to be transferred to the photoresist;
    generating exposure light;
    determining, from the information regarding the pattern of the photomask, a form for the shape of the exposure light to be directed through the photomask and onto the photoresist; and
    reflecting rays of the exposure light, along an optical axis through the photomask, with an array of micro mirrors disposed side-by-side and oriented to shape the exposure light into said form;
    wherein the array of micro mirrors directs the exposure light onto the photomask at oblique angles relative to a plane of the photomask to prevent $0^{th}$ order incident light from reaching the photomask.

11. The method of claim 10, wherein said reflecting comprises adjusting relative inclinations of said micro mirrors individually, relative to said optical axis.

12. The method of claim 11, wherein said reflecting comprises directing rays of the exposure light onto the photomask at oblique angles relative to the plane of the photomask.

* * * * *